(12) United States Patent
Huang et al.

(10) Patent No.: US 12,291,795 B2
(45) Date of Patent: May 6, 2025

(54) SINGLE CRYSTAL GROWTH SUSCEPTOR ASSEMBLY WITH SACRIFICE RING

(71) Applicant: GlobalWafers Co., Ltd., Hsinchu (TW)

(72) Inventors: Hong-Huei Huang, Zhubei (TW); Benjamin Michael Meyer, Defiance, MO (US); Chun-Sheng Wu, Hsinchu (TW); Wei-Chen Chou, Taipei (TW); Chen-Yi Lin, Miaoil (TW); Feng-Chien Tsai, Zhubai (TW)

(73) Assignee: GlobalWafers Co., Ltd., Hsinchu (TW)

( * ) Notice: Subject to any disclaimer, the term of this patent is extended or adjusted under 35 U.S.C. 154(b) by 142 days.

(21) Appl. No.: 17/939,192

(22) Filed: Sep. 7, 2022

(65) Prior Publication Data
US 2024/0076797 A1 Mar. 7, 2024

(51) Int. Cl.
*C30B 15/10* (2006.01)
*C30B 15/20* (2006.01)
*C30B 29/06* (2006.01)

(52) U.S. Cl.
CPC .............. *C30B 15/10* (2013.01); *C30B 15/20* (2013.01); *C30B 29/06* (2013.01); *Y10T 117/1032* (2015.01)

(58) Field of Classification Search
CPC ......... C30B 15/10; C30B 15/20; C30B 29/06; C30B 35/002; Y10T 117/1032
See application file for complete search history.

(56) References Cited

U.S. PATENT DOCUMENTS

| 7,708,827 B2 | 5/2010 | Kahl et al. |
| 10,000,863 B2 | 1/2018 | Okita et al. |
| 2002/0166503 A1 | 11/2002 | Magras et al. |
| 2015/0136017 A1 * | 5/2015 | Hiraoka ................ C30B 35/002 117/208 |
| 2020/0001335 A1 | 1/2020 | Okita et al. |

FOREIGN PATENT DOCUMENTS

| CN | 103469294 A | 12/2013 |
| CN | 209779039 U | 12/2019 |
| CN | 211814713 U | 10/2020 |
| JP | 2002154892 A | 5/2002 |
| JP | 2013147406 A | 8/2013 |
| TW | 200302809 A | 8/2003 |
| WO | 1998055238 A1 | 12/1998 |
| WO | 2016037506 A1 | 3/2016 |

OTHER PUBLICATIONS

International Search Report and Written Opinion issued for PCT/US2023/031711, dated Nov. 27, 2023 (20 pages).

* cited by examiner

*Primary Examiner* — Hua Qi
(74) *Attorney, Agent, or Firm* — Armstrong Teasdale LLP

(57) ABSTRACT

A susceptor assembly for supporting a crucible during a crystal growth process includes a susceptor base, a tubular sidewall connected to the susceptor base, and a removable sacrifice ring interposed between the susceptor base and the sidewall. Each of the susceptor base and the sidewall is formed of a carbon-containing material. The susceptor base has an annular wall and a shoulder extending radially outward from an outer surface of the annular wall. The sidewall has a first end that receives the annular wall to connect the sidewall to the susceptor base. The sacrifice ring has a first surface that faces the outer surface of the annular wall, a second surface that faces an interior surface of the sidewall, and a ledge extending outward from the second surface that engages the first end of the sidewall.

20 Claims, 9 Drawing Sheets

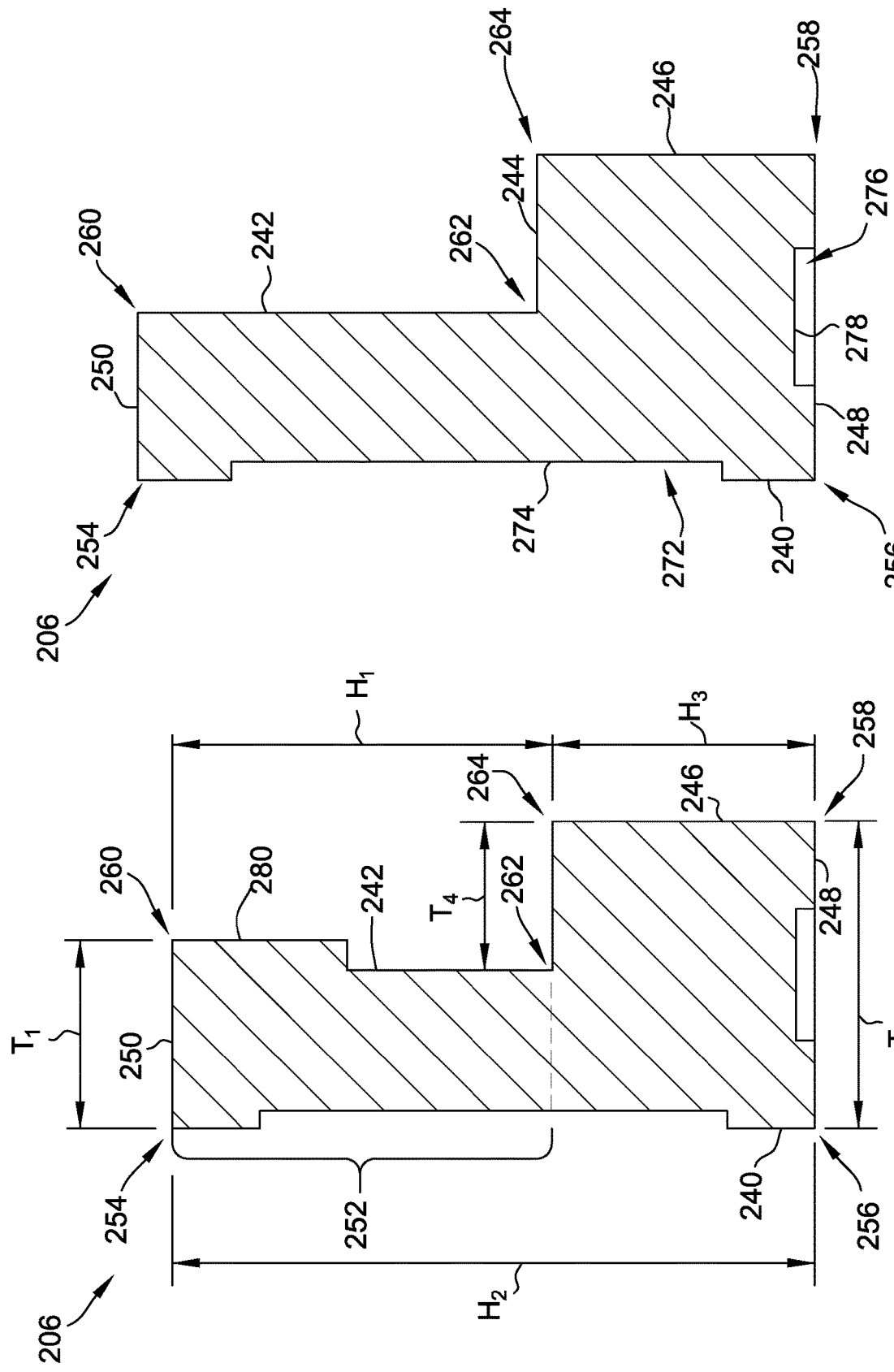

300

```
┌─────────────────────────────────────────────────┐
│ PROVIDING A SUSCEPTOR BASE HAVING A CONCAVE     │
│ SURFACE EXTENDING RADIALLY INWARD FROM AN       │
│ UPPER EDGE, AND AN ANNULAR WALL EXTENDING       │── 302
│ FROM THE UPPER EDGE TO A SHOULDER, THE          │
│ SHOULDER EXTENDING RADIALLY OUTWARD FROM        │
│ AN OUTER SURFACE OF THE ANNULAR WALL OPPOSITE   │
│ THE CONCAVE SURFACE                             │
└─────────────────────────────────────────────────┘
                         ↓
┌─────────────────────────────────────────────────┐
│ INSTALLING A SACRIFICE RING ONTO THE SUSCEPTOR  │
│ BASE, THE SACRIFICE RING HAVING A FIRST SURFACE │
│ THAT OVERLAYS THE OUTER SURFACE OF THE ANNULAR  │
│ WALL, A SECOND SURFACE OPPOSITE THE FIRST       │── 304
│ SURFACE, A LEDGE EXTENDING OUTWARD FROM THE     │
│ SECOND SURFACE, AND A THIRD SURFACE OPPOSITE    │
│ THE LEDGE THAT OVERLAYS THE SHOULDER OF         │
│ THE SUSCEPTOR BASE                              │
└─────────────────────────────────────────────────┘
                         ↓
┌─────────────────────────────────────────────────┐
│ CONNECTING A TUBULAR SIDEWALL TO THE SUSCEPTOR  │
│ BASE BY INSERTING THE ANNULAR WALL OF THE       │
│ SUSCEPTOR BASE INTO A FIRST END OF THE SIDEWALL │
│ SUCH THAT THE FIRST END ENGAGES THE LEDGE OF    │── 306
│ THE SACRIFICE RING AND THE SACRIFICE RING IS    │
│ INTERPOSED BETWEEN THE SIDEWALL AND EACH OF     │
│ THE OUTER SURFACE OF THE ANNULAR WALL AND       │
│ THE SHOULDER OF THE SUSCEPTOR BASE              │
└─────────────────────────────────────────────────┘
                         ↓
┌ ─ ─ ─ ─ ─ ─ ─ ─ ─ ─ ─ ─ ─ ─ ─ ─ ─ ─ ─ ─ ─ ─ ─ ┐
  POSITIONING A CRUCIBLE IN AN INTERIOR OF THE
  SUSCEPTOR ASSEMBLY DEFINED BY AN INTERIOR        ── 308
  SURFACE OF THE SIDEWALL AND THE CONCAVE
  SURFACE OF THE SUSCEPTOR BASE
└ ─ ─ ─ ─ ─ ─ ─ ─ ─ ─ ─ ─ ─ ─ ─ ─ ─ ─ ─ ─ ─ ─ ─ ┘
                         ↓
┌ ─ ─ ─ ─ ─ ─ ─ ─ ─ ─ ─ ─ ─ ─ ─ ─ ─ ─ ─ ─ ─ ─ ─ ┐
      REMOVING THE CRUCIBLE FROM THE INTERIOR      ── 310
└ ─ ─ ─ ─ ─ ─ ─ ─ ─ ─ ─ ─ ─ ─ ─ ─ ─ ─ ─ ─ ─ ─ ─ ┘
                         ↓
┌ ─ ─ ─ ─ ─ ─ ─ ─ ─ ─ ─ ─ ─ ─ ─ ─ ─ ─ ─ ─ ─ ─ ─ ┐
   REMOVING THE SIDEWALL FROM THE SUSCEPTOR BASE   ── 312
└ ─ ─ ─ ─ ─ ─ ─ ─ ─ ─ ─ ─ ─ ─ ─ ─ ─ ─ ─ ─ ─ ─ ─ ┘
                         ↓
┌ ─ ─ ─ ─ ─ ─ ─ ─ ─ ─ ─ ─ ─ ─ ─ ─ ─ ─ ─ ─ ─ ─ ─ ┐
  REMOVING THE SACRIFICE RING FROM THE SUSCEPTOR   ── 314
  BASE
└ ─ ─ ─ ─ ─ ─ ─ ─ ─ ─ ─ ─ ─ ─ ─ ─ ─ ─ ─ ─ ─ ─ ─ ┘
```

FIG. 9

SINGLE CRYSTAL GROWTH SUSCEPTOR ASSEMBLY WITH SACRIFICE RING

FIELD

The field relates generally to susceptor assemblies for supporting a crucible during a single crystal growth process and, more particularly, to a single crystal growth susceptor assembly with a removable sacrifice ring.

BACKGROUND

Single crystal silicon, which is the starting material for most processes for the fabrication of many electronic components such as semiconductor devices and solar cells, is commonly prepared by batch Czochralski (CZ) or Continuous Czochralski (CCZ) methods. In these methods, a polycrystalline source material, such as polycrystalline silicon ("polysilicon"), in the form of solid feedstock material is charged to a quartz crucible and melted, a single seed crystal is brought into contact with the molten silicon or melt, and a single crystal silicon ingot is grown by slow extraction.

In these methods, the quartz crucible is dimensionally unstable at the high temperatures needed to melt the solid feedstock material. To prevent warping or deformation of the crucible during the crystal growth process, the crucible is supported by a susceptor assembly, which is suitably formed of carbon-containing materials such as graphite or carbon fiber that are dimensionally stable at the temperatures needed to melt the silicon feedstock material. In some methods, a so-called "hybrid" susceptor assembly may be used that includes a susceptor base and a cylindrical sidewall removably connected to the susceptor base, each of the base and the sidewall being formed of a carbon-containing material. Together, the susceptor base and the sidewall form an interior space that receives the crucible.

During the crystal growth process, silicon-containing gases evaporate from the melt contained within the crucible, such as silicon oxide ($SiO_x$) species. The silicon-containing gases may contact carbon-containing materials of the susceptor assembly. The carbon-containing materials and the silicon-containing gases may react with one another to generate oxidized carbon and silicon products in a gaseous form, as well as silicon carbide (SiC) deposits on the susceptor assembly. In multi-part susceptors, the SiC deposits may accumulate along abutting surfaces of components of the susceptor. The accumulated SiC deposits may negatively impact the ability of the components to fit together, thus deteriorating the structural integrity of the susceptor.

For example, in methods where a hybrid susceptor assembly is used, SiC precipitates may form and accumulate along a ledge of the susceptor base that forms a contact interface with the sidewall. SiC continues to accumulate on the base ledge, for example, during successive crystal growth processes, which negatively impacts the connection between the susceptor base and the sidewall along the contact interface. The SiC deposits have a hardness close to diamond, and removal of the SiC deposits from the base ledge is both costly and time-consuming, which increases downtime and associated costs. As such, the susceptor base is frequently replaced due to the accumulation of SiC deposits along the ledge well before the base has otherwise reached its operational lifetime limit, which increases material costs.

In addition, the accumulated SiC deposits may result in the susceptor base and the sidewall being bonded together with sufficient strength that the susceptor base and the sidewall cannot be separated without damaging one or both of the parts. As such, if the sidewall is damaged during operation, an undamaged susceptor base bonded to the damaged sidewall cannot be salvaged. Similarly, if the susceptor base is damaged during operation, an undamaged sidewall bonded to the damaged base cannot be salvaged.

A need exists for a susceptor assembly that solves the above-mentioned problems of SiC deposit accumulation along a contact interface between the susceptor base and the sidewall and/or bonding of the susceptor base and the sidewall as a result of SiC deposit accumulation, facilitates increasing the useful lifetime of the susceptor base and the sidewall of the susceptor assembly, and facilitates reducing material costs associated with premature discarding of the susceptor assembly parts.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art. Additionally, this section does not describe the scope of the various aspects of the disclosure, and is not intended to limit the scope of the disclosure in any way.

SUMMARY

In one aspect, a susceptor assembly for supporting a crucible during a crystal growth process includes a susceptor base, a tubular sidewall connected to the susceptor base, and a removable sacrifice ring interposed between the susceptor base and the sidewall. Each of the susceptor base and the sidewall is formed of a carbon-containing material. The susceptor base has a concave surface extending radially inward from an upper edge, and an annular wall extending from the upper edge to a shoulder. The shoulder extends radially outward from an outer surface of the annular wall opposite the concave surface. The sidewall has a first end that receives the annular wall to connect the sidewall to the susceptor base. An interior surface of the sidewall and the concave surface of the susceptor base define an interior of the susceptor assembly that is sized and shaped to receive a crucible therein. The sacrifice ring has a first surface that faces the outer surface of the annular wall, a second surface that faces the interior surface of the sidewall, and a ledge extending outward from the second surface that engages the first end of the sidewall.

In another aspect, a method of assembling a susceptor for supporting a crucible during a crystal growth process includes providing a susceptor base, installing a sacrifice ring onto the susceptor base, and connecting a tubular sidewall to the susceptor base such that the sacrifice ring is interposed between the susceptor base and the sidewall. Each of the susceptor base and the sidewall is formed of a carbon-containing material. The susceptor base has a concave surface extending radially inward from an upper edge, and an annular wall extending from the upper edge to a shoulder. The shoulder extends radially outward from an outer surface of the annular wall opposite the concave surface. The sacrifice ring has a first surface that surrounds the outer surface of the annular wall, a second surface opposite the first surface, a ledge extending outward from the second surface, and a third surface opposite the ledge that overlays the shoulder of the susceptor base. The sidewall is connected to the susceptor base by inserting the annular wall into a first end of the sidewall such that the first end engages the ledge of the sacrifice ring and the sacrifice ring is interposed between the sidewall and each of the outer surface of the annular wall and the shoulder.

In yet another aspect, a method of producing a single crystal silicon ingot from a silicon melt includes providing a susceptor assembly including a susceptor base, a tubular sidewall connected to the susceptor base, and a removable sacrifice ring interposed between the susceptor base and the sidewall. Each of the susceptor base and the sidewall is formed of a carbon-containing material. The method includes positioning a crucible in an interior of the susceptor assembly defined by the susceptor base and the sidewall, adding polycrystalline silicon to the crucible, heating the polycrystalline silicon to cause a silicon melt to form in the crucible, and pulling a single crystal silicon ingot from the melt. Silicon carbide (SiC) deposits accumulate on the sacrifice ring during the pulling the single crystal silicon ingot from the melt. The method also includes, after the pulling the single crystal silicon ingot from the melt, removing the sacrifice ring having the accumulated SiC deposits from the susceptor base.

BRIEF DESCRIPTION OF THE DRAWINGS

FIGS. 7 and 8 are cross-sections of the sacrifice ring taken along lines A-A and B-B, respectively, shown in FIG. 6;

FIG. 9 is a method of assembling the susceptor assembly shown in FIGS. 2-5; and

Corresponding reference characters indicate corresponding parts throughout the drawings.

DETAILED DESCRIPTION

Figure 1:
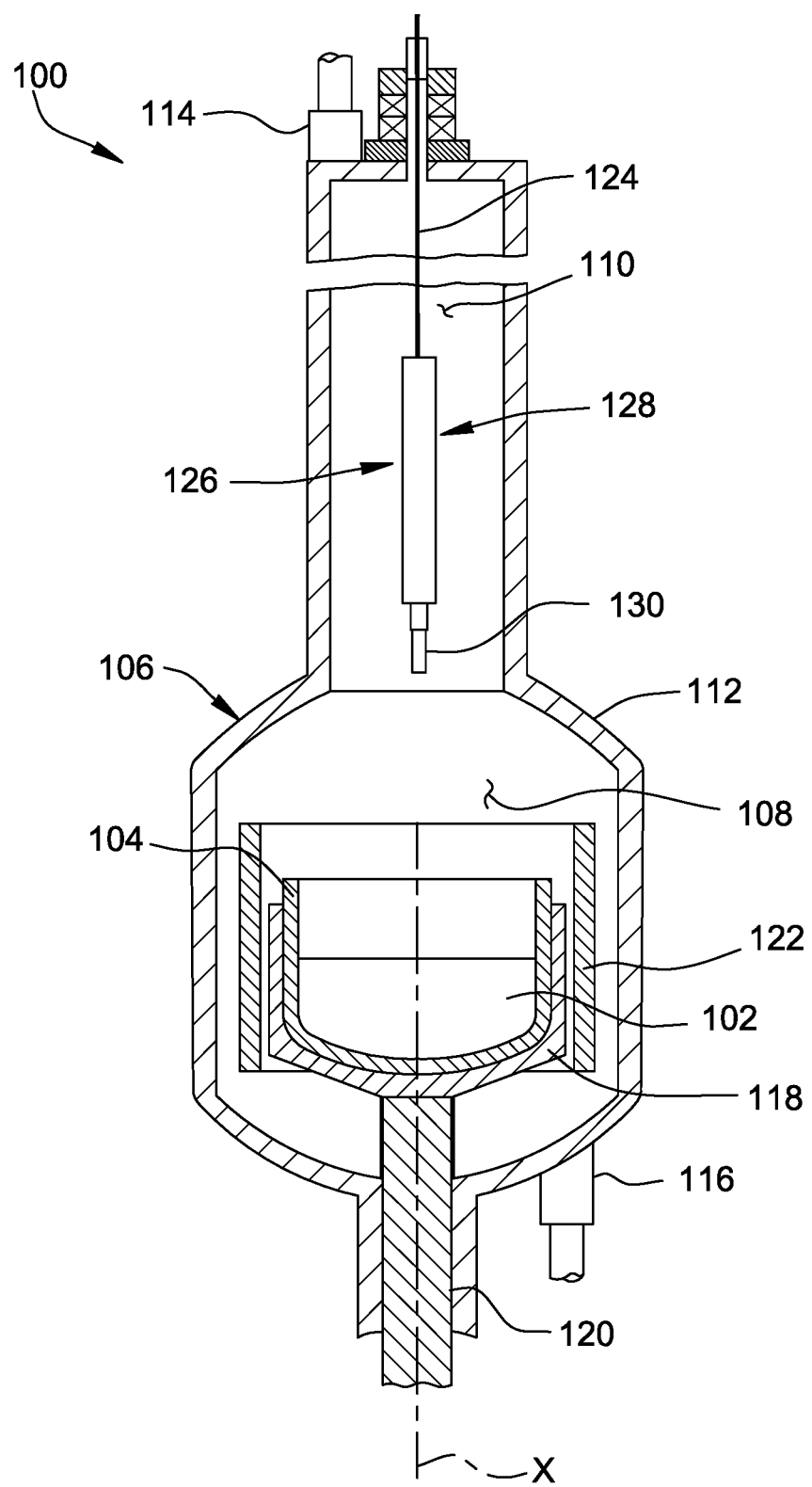
FIG. 1 is a schematic cross-section of a pulling apparatus for forming a single crystal silicon ingot.
Figure 2:
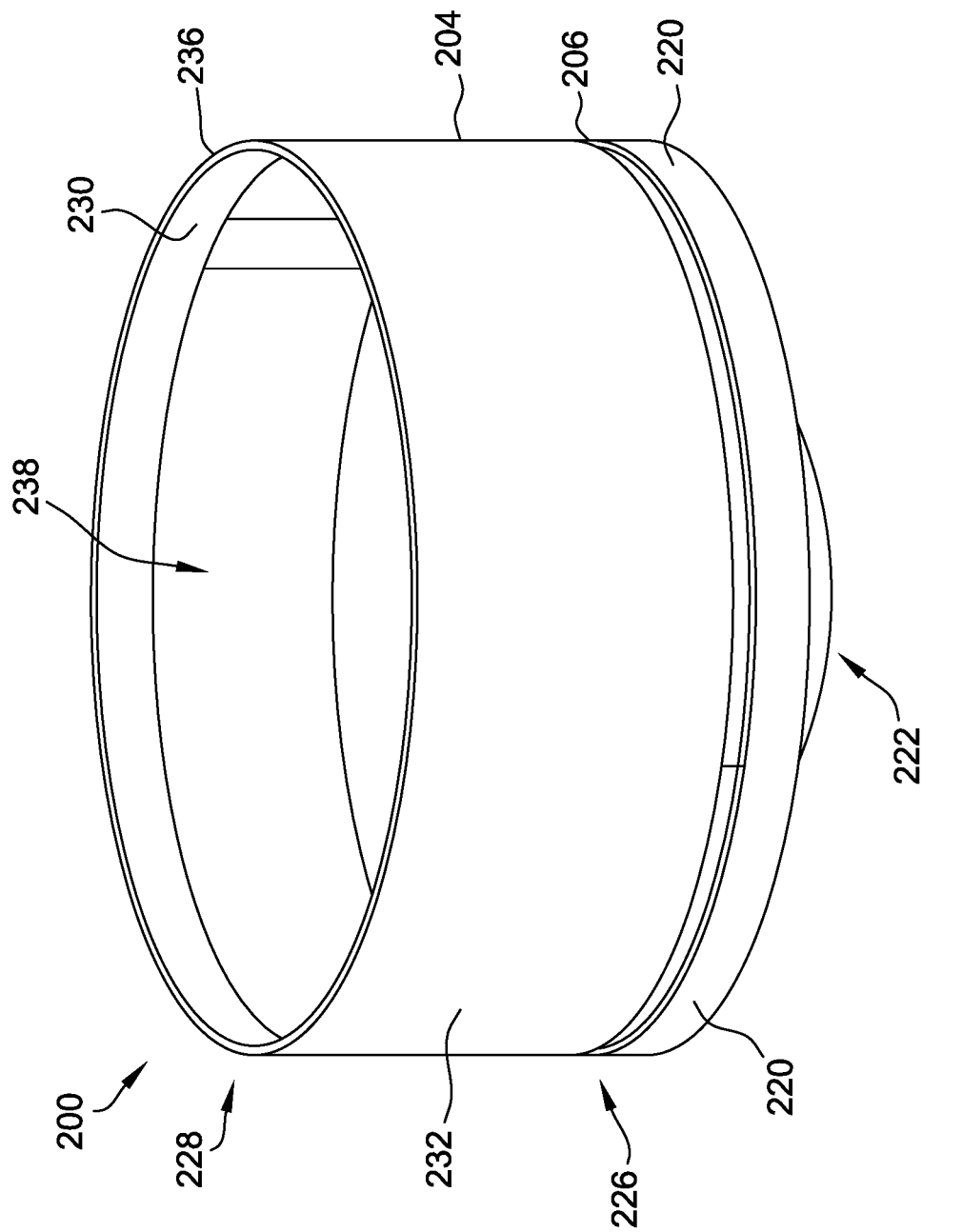
FIG. 2 is a perspective view of a susceptor assembly for use in the pulling apparatus shown in FIG. 1.

Referring to FIG. 1, an ingot pulling apparatus or ingot puller is shown schematically and is indicated generally at 100. The ingot puller 100 is used to produce single crystal (i.e., monocrystalline) ingots of semiconductor or solar-grade material such as, for example, single crystal silicon ingots. In some embodiments, the ingot is grown by the so-called Czochralski (CZ) process in which the ingot is withdrawn from a silicon melt 102 held within a crucible 104 of crystal puller 100. In some embodiments, the ingot is grown by a batch CZ process in which polycrystalline silicon is charged to the crucible 104 in an amount sufficient to grow one ingot, such that the crucible 104 is essentially depleted of silicon melt 102 after the growth of the one ingot. In other embodiments, the ingot is grown by a continuous CZ (CCZ) process in which polycrystalline silicon is continually or periodically added to crucible 104 to replenish silicon melt 102 during the growth process. The CCZ process facilitates growth of multiple ingots pulled from a single melt 102. Embodiments of the present disclosure are not limited to a particular crystal growth process.

The ingot puller 100 includes a housing 106 that defines a crystal growth chamber 108 and a pull chamber 110 having a smaller transverse dimension than the growth chamber 108. The growth chamber 108 has a generally dome shaped upper wall 112 transitioning from the growth chamber 108 to the narrowed pull chamber 110. The ingot puller 100 includes an inlet port 114 and an outlet port 116 which may be used to introduce and remove a process gas to and from the ingot puller 100 during crystal growth.

The crucible 104 within the ingot puller 100 contains the silicon melt 102 from which a silicon ingot is drawn. The crucible 104 is suitably made of quartz or fused silica, both of which have a high melting point and thermal stability and are generally non-reactive with molten silicon in the melt 102. The crucible 104 may include other materials in addition to quartz, for example, the quartz crucible 104 may be a composite material including silica, silicon nitride or silicon carbide.

The silicon melt 102 is obtained by melting polycrystalline silicon charged to the crucible 104. In continuous systems, a feed system (not shown) is used for feeding solid feedstock material into the crucible 104 and/or the melt 102. The crucible 104 is positioned within and supported by a susceptor 118 that is in turn supported by a rotatable shaft 120. The susceptor 118 and the rotatable shaft 120 facilitate rotation of the crucible 104 about a central longitudinal axis X of the ingot puller 100. During operation, the temperatures needed to melt the silicon charge and/or maintain the melt 102 may also cause the quartz crucible 104 to soften. The susceptor 118, which is suitably made of graphite or other graphene- or carbon-containing material that has a high thermal stability, provides a rigid outer structure for supporting the softened crucible 104.

A heating system 122 (e.g., one or more electrical resistance heaters or a radio-frequency heating system) surrounds the susceptor 118 and the crucible 104 and supplies heat by conduction through the susceptor 118 and the crucible 104 for melting the silicon charge to produce the melt 102 and/or maintaining the melt 102 in a molten state. The heater 122 may also extend below the susceptor 118 and the crucible 104. The heating system 122 is controlled by a control system (not shown) so that the temperature of the melt 102 is precisely controlled throughout the pulling process. For example, the controller may control electric current provided to the heating system 122 to control the amount of thermal energy supplied by the heating system 122. The controller may control the heating system 122 so that the temperature of the melt 102 is maintained above about the melting temperature of silicon (e.g., about 1412° C.). For example, the melt 102 may be heated to a temperature of at least about 1425° C., at least about 1450° C. or even at least about 1500° C. Insulation (not shown) surrounding the heating system 122 may reduce the amount of heat lost through the housing 106. The ingot puller 100 may also include a heat shield assembly (not shown) above the surface of melt 102 for shielding the ingot from the heat of the crucible 104 to increase the axial temperature gradient at the solid-melt interface.

A pulling mechanism is attached to a pull wire 124 that extends from the pulling mechanism and is capable of raising, rotating and lowering the pull wire 124. The ingot puller 100 may have a pull shaft rather than a wire, depending upon the type of puller. The pull wire 124 terminates in a pulling assembly 126 that includes a seed crystal chuck 128 which holds a seed crystal 130 used to grow the silicon ingot. In growing the ingot, the pulling mechanism lowers the seed crystal 130 until it contacts the surface of the silicon melt 102. Once the seed crystal 130 begins to melt, the pulling mechanism slowly raises the seed crystal up through the growth chamber 108 and pull chamber 110 to grow the single crystal ingot. The speed at which the pulling mechanism rotates the seed crystal 130 and the speed at which the pulling mechanism raises the seed crystal (i.e., the pull rate v) are controlled by the control system. As the seed crystal 130 is slowly raised from the melt 102, silicon atoms from the melt 102 align themselves with and attach to the seed crystal 130 to form an ingot.

A process gas (e.g., argon) is introduced through the inlet port 114 into the growth chamber 108 and pull chamber 110 and is withdrawn through the outlet port 116. The process gas creates an atmosphere within the housing and the melt and atmosphere form a melt-gas interface. The outlet port 116 is in fluid communication with an exhaust system (not shown) of the ingot puller 100.

Figure 3:
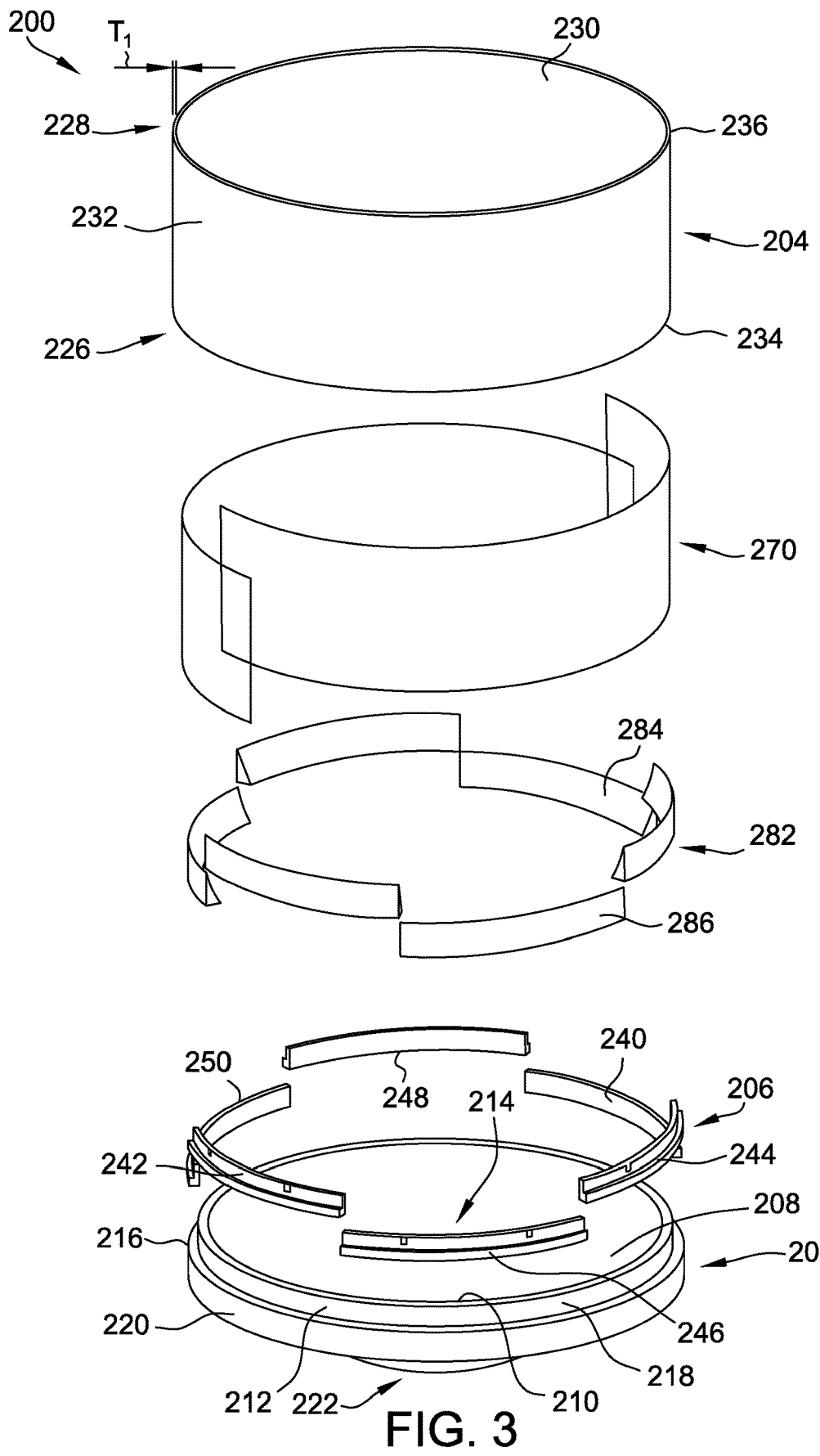
FIG. 3 is an exploded view of the susceptor assembly shown in FIG. 2.

Referring to FIGS. 2-5, an example susceptor assembly is indicated generally at 200. The susceptor assembly 200 is suitably used as the susceptor 118 for supporting the crucible 104 in the ingot puller 100 (shown in FIG. 1). The susceptor assembly 200 includes a susceptor base 202, a tubular sidewall 204 connected to the susceptor base 202, and a sacrifice ring 206 interposed between the base 202 and the sidewall 204. Each of the base 202, the sidewall 204, and the sacrifice ring 206 are suitably made of carbon-containing material that has a high thermal stability. The susceptor base 202 and the sacrifice ring 206 may each be formed of graphite, for example. The tubular sidewall 204 is suitably formed of carbon fiber-reinforced polymer (also referred to herein as "carbon fiber" or "carbon fiber composite"). The tubular sidewall 204 may alternatively be formed of graphite. As shown in FIG. 3, the tubular sidewall 204 is a unitary structure. In other examples, the tubular sidewall 204 may be formed of two or more interlocking segments (e.g., two or more interlocking carbon fiber segments or two or more interlocking graphite segments).

The susceptor base 202 has a concave surface 208 that extends radially inward from an upper edge 210 and defines a recess 214 in the susceptor base 202. An annular wall 212 circumscribes the recess 214 and extends downward from the upper edge 210 to a shoulder 216. The recess 214 is generally shaped to complement a shape of a bottom of the crucible 104 (shown in FIG. 1) that is received by the susceptor assembly 200. In the example embodiment, the recess 214 is hemispherical in shape, defined by the shape of the annular wall 212 and the concave surface 208. The recess 214 may be alternatively shaped depending on the application and the configuration of the crucible 104. For example, the recess 214 may be square or rectangularly shaped. In these examples, the surface 208 may be a flat surface 208 that is recessed from a square or rectangularly shaped upper edge 210 and surrounded by a square or rectangularly shaped wall 212.

The shoulder 216 extends radially outward from an outer surface 218 of the annular wall 212. The shoulder 216 joins the annular wall 212 and a circumferential edge 220 of the susceptor base 202. In general, the circumferential edge 220 defines the outermost circumference of the susceptor base 202, and the shoulder 216 has a radial length L between the circumferential edge 220 and the outer surface 218. The radial length L of the shoulder 216 is a suitable distance to facilitate supporting components of the susceptor assembly 200 stacked on the susceptor base 202 (e.g., the sidewall 204 and the sacrifice ring 206). In the example embodiment, the shoulder 216 defines a flat surface that is orthogonal with the outer surface 218 of the annular wall 212, such that the shoulder 216 and the outer surface define an L-shape. In other examples, the outer surface 218 and/or the shoulder 216 may have alternative orientations. Additionally, the transition between the outer surface 218 and the shoulder 216 may be sharp or angular, or may be rounded to provide a smooth transition between the adjacent surfaces.

A bottom portion 222 of the susceptor base 202 extends downward from the circumferential edge 220. The bottom portion 222 is joined the to the circumferential edge 220 by a bottom surface 224. The bottom portion 222 provides a bulk region in the susceptor base 202 below the concave surface 208. The bulk region enables features (not shown) to be formed in the bottom portion 222. The features formed in the bottom portion 222 facilitate securing the susceptor base 202 to the rotatable shaft 120 of the ingot puller 100 (shown in FIG. 1). The bottom surface 224 includes one or more cut-aways 290. The cut-aways 290 enable the bottom surface 224 to form a "drip edge" from which molten silicon that may drip down the circumferential edge 220 during operation falls off before reaching the bottom portion 222. The drip edge formed by the bottom surface 224 prevents molten silicon from running down the bottom portion 222 and reaching the rotatable shaft 120 and potentially damaging seals of these components.

The tubular sidewall 204 connects at a first end 226 to the susceptor base 202 and extends to a second end 228. The sidewall 204 is cylindrically shaped in this example to complement a shape of a side of the crucible 104 (shown in FIG. 1), with a circular cross-section that complements the shape of the annular wall 212. The sidewall 204 may be alternatively shaped (e.g., may have a rectangular shape with a square cross section), based on the application and the configuration of the crucible 104. Together, the tubular sidewall 204 and the concave surface 208 of the base 202 define an interior 238 of the susceptor assembly 200 that is sized and shaped to receive the crucible 104 therein. The sidewall 204 includes an interior surface 230 that faces the interior 238 and an opposite exterior surface 232. Each of the interior surface 230 and the exterior surface 232 extend between the first end 226 and the second end 228. The interior surface 230 and the exterior surface 232 are joined by a first edge 234 at the first end 226 and a second edge 236 at the second end 228.

The sidewall 204 connects to the susceptor base 202 by receiving the annular wall 212 at the first end 226. When the sidewall 204 is connected to the base 202, and the interior surface 230 of the sidewall 204 faces the outer surface 218 of the annular wall 212, and the first edge 234 is supported by the shoulder 216. The exterior surface 232 is substantially flush with the circumferential edge 220 when the sidewall 204 is connected to the base 202. A thickness $T_1$ of the sidewall 204, measured between the interior surface 230 and the exterior surface 232, is suitably less than the radial length L of the shoulder 216 to provide space for the sacrifice ring 206 interposed between the base 202 and the sidewall 204, described below.

Carbon fiber material that may be used to form the sidewall 204 enables a reduction in the thickness $T_1$ of the sidewall 204 relative to a thickness of sidewalls formed of other carbon-containing materials (e.g., graphite). Specifically, carbon fiber material has high thermal stability, high resistance to thermal shock due to high thermal conductivity and low thermal expansion behavior, as well as high toughness, strength, and stiffness in high-temperature applications. By reducing the thickness $T_1$ of the sidewall 204, the volume of the interior 238 of the susceptor assembly 200 can be increased, which in turn increases the size of the crucible 104 that the susceptor assembly 200 is able to support and the volume of the melt 102 contained in the crucible 104.

The sacrifice ring 206 has an inner surface 240, an opposite outer surface 242, and a ledge 244 extending radially outward from the outer surface 242. The ledge 244 joins the outer surface 242 and the outer edge 246. The sacrifice ring also includes a bottom surface 248 that joins the outer edge 246 and the inner surface 240, and an upper edge 250 opposite the bottom surface 248. The upper edge 250 joins the inner surface 240 and the outer surface 242.

Figure 6:
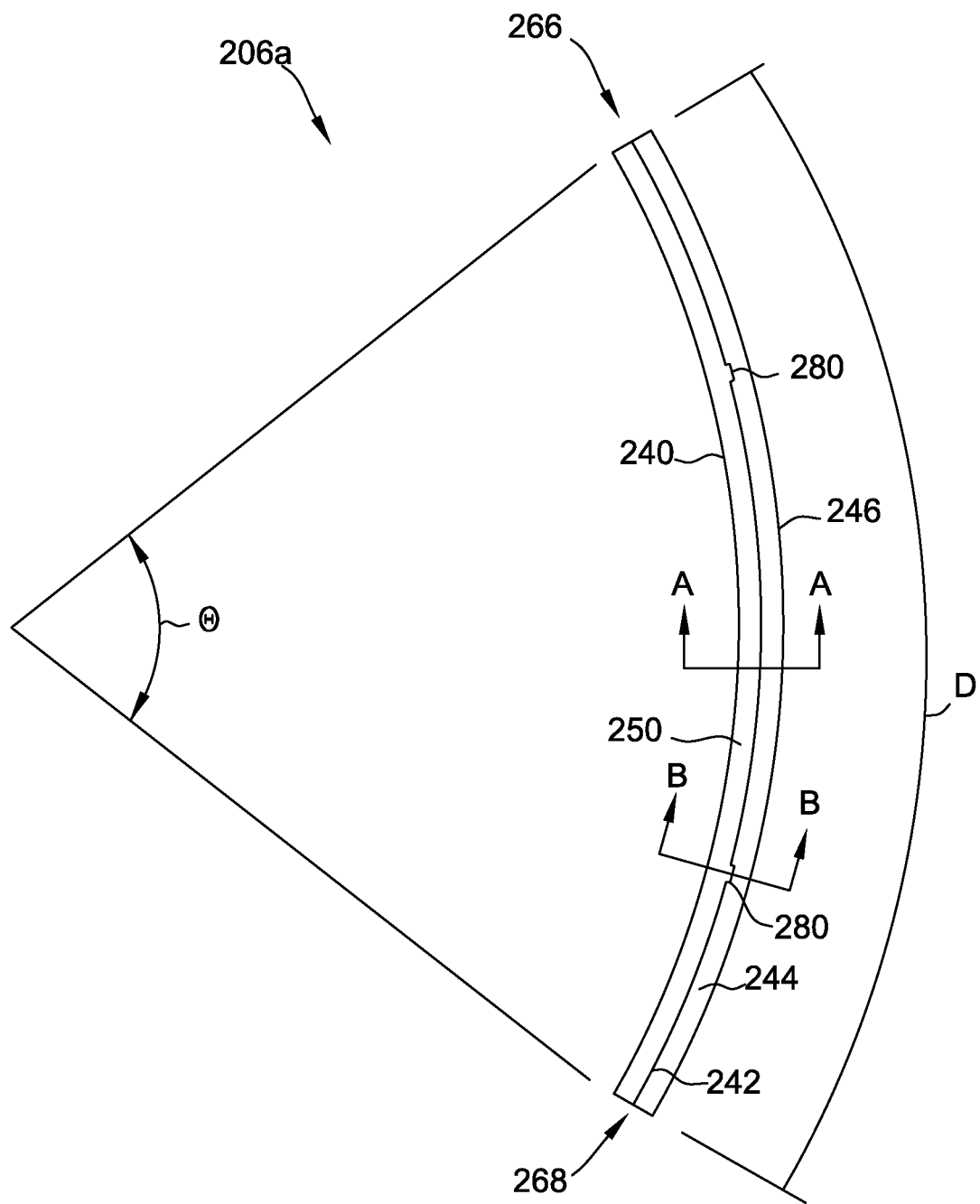
FIG. 6 is a top view of an arcuate segment that forms the sacrifice ring used in the susceptor assembly shown in FIGS. 2-5.

The sacrifice ring 206 may be a unitary, one-piece structure, or the sacrifice ring 206 may be segmented into two or more arcuate segments 206a. FIG. 6 shows an isolated top view of an arcuate segment 206a used to form the sacrifice ring 206 is shown. Each arcuate segment 206a includes the same elements and features as the arcuate segment 206a shown in FIG. 6 to form the elements and features of the sacrifice ring 206 (e.g., the inner surface 240, the outer surface 242, the ledge 244, the bottom surface 248, and the upper edge 250). Accordingly, like reference characters are shown and described for the sacrifice ring 206 and the arcuate segment 206a, and the description of the elements and the features of the sacrifice ring 206 apply similarly to the elements and features of the arcuate segment 206a unless explicitly stated otherwise.

The sacrifice ring 206 of this embodiment includes six arcuate segments 206a. Each arcuate segment 206a is equally sized and has an arc measure Θ of 60 degrees such that, collectively, the segments 206a form the 360 degree circumferential extent of the sacrifice ring 206. In other examples, the sacrifice ring 206 may include more or fewer arcuate segments 206a, such as two, three, four, five, seven, eight, nine, or ten arcuate segments 206a, for example. The arc measure Θ of the arcuate segments 206a varies according to the number of arcuate segments 206a used, and the arcuate segments 206a may be equally or unequally sized. In examples where the arcuate segments 206a are equally sized, the arc measure Θ of each arcuate segment 206a may be 360 degrees/n, where n is the number of arcuate segments 206a forming the sacrifice ring 206. For example, two equally sized segments 206a would each have a 180 degree arc measure Θ, three equally sized segments would each have a 120 degree arc measure Θ, and so on. In some examples, small gaps may be formed in the segmented sacrifice ring 206 between adjacent arcuate segments 206a. In these examples, for equally sized arcuate segments 206a, the arc measure Θ of each arcuate segment 206a is less than 360 degrees/n. Any one of the segments 206a may be installed on and removed from the susceptor base 202 independent from the other segments. As such, reference made herein to installing and removing the sacrifice ring 206 may refer to independently installing and removing one, more than one and less than all, or all of the segments 206a of the sacrifice ring 206. The sacrifice ring 206 may also be formed as a unitary, one-piece structure, in which case the arcuate segment 206a completely forms the sacrifice ring 206.

Each arcuate segment 206a extends an arc length D between a first circumferential edge 266 and a second circumferential edge 268. The first circumferential edge 266 of each arcuate segment 206a abuts the second circumferential edge 268 of an adjacent arcuate segment 206a. The first and second circumferential edges 266 and 268 may form a flat surface, such that no interlocking between adjacent arcuate segments 206a is provided. The absence of interlocking features between adjacent arcuate segments 206a may facilitate easier installation and removal of independent arcuate segments 206a. A segmented sacrifice ring 206 without interlocking features between adjacent segments 206a may be held in place when installed on the susceptor base 202 by force exerted by the sidewall 204. Alternatively, the first and second circumferential edges 266 and 268 may include interlocking features to interlock adjacent segments 206a to facilitate holding the segmented sacrifice ring 206 in place of the susceptor base 202. In examples where a unitary, one-piece sacrifice ring 206 is used, no interlocking features are necessary as only one segment 206a forms the sacrifice ring 206.

FIG. 7 shows a cross-section of the sacrifice ring 206 formed of the arcuate segments 206a, taken along line A-A shown in FIG. 6. FIG. 8 shows a cross-section of the sacrifice ring 206 formed of the arcuate segments 206a, taken along line B-B shown in FIG. 6. The cross sections of the sacrifice ring 206 shown in FIGS. 7 and 8 are not limited to a segmented ring structure, and a unitary sacrifice ring 206 or a sacrifice ring 206 segmented into any number of segments 206a has the cross sections shown in FIGS. 7 and 8 and described below.

As shown in FIGS. 7 and 8, the outer surface 242 extends from a first end 260 adjacent the upper edge 250 to a second end 262 adjacent the ledge 244, and the outer surface 242 has a height $H_1$ measured between the first end 260 and the second end 262. An upper portion 252 of the sacrifice ring 206 extends between the ledge 244 and the upper edge 250, and the upper portion 252 has the height $H_1$ of the outer surface 242. The inner surface 240 has a first end 254 adjacent the upper edge 250 and extends downward from the first end 254 beyond the upper portion 252 to a second end 256 adjacent the bottom surface 248. As such, a height $H_2$ of the inner surface 240 between the first end 254 and the second end 256 is greater than the height $H_1$ of the outer surface 242 and the upper portion 252. The height $H_2$ may be substantially equal to the sum of the height $H_1$ and a height $H_3$ of the outer edge 246. The height $H_3$ is measured as a distance that the outer edge 246 extends between a first end 258 of the outer edge 246 adjacent the bottom surface 248 and a second end 264 of the outer edge 246 adjacent the ledge 244.

The bottom surface 248 has a thickness $T_2$ measured as a distance that the bottom surface 248 extends between the second end 256 of the inner surface 240 and the first end 258 of the outer edge 246. The upper edge 250 has a thickness $T_3$ measured as a distance that the upper edge 250 extends between the first end 254 of the inner surface 240 and the first end 260 of the outer surface 242. The ledge 244 has a thickness $T_4$ measured as a distance that the ledge 244 extends between the second end 264 of the outer edge 246 and the second end 262 of the outer surface 242. The thickness $T_2$ of the bottom surface 248 is greater than each of the thickness $T_3$ of the upper edge 250 and the thickness $T_4$ of the ledge 244, and the thickness $T_2$ may be substantially equal to a sum total of the thicknesses $T_3$ and $T_4$.

Figure 4:
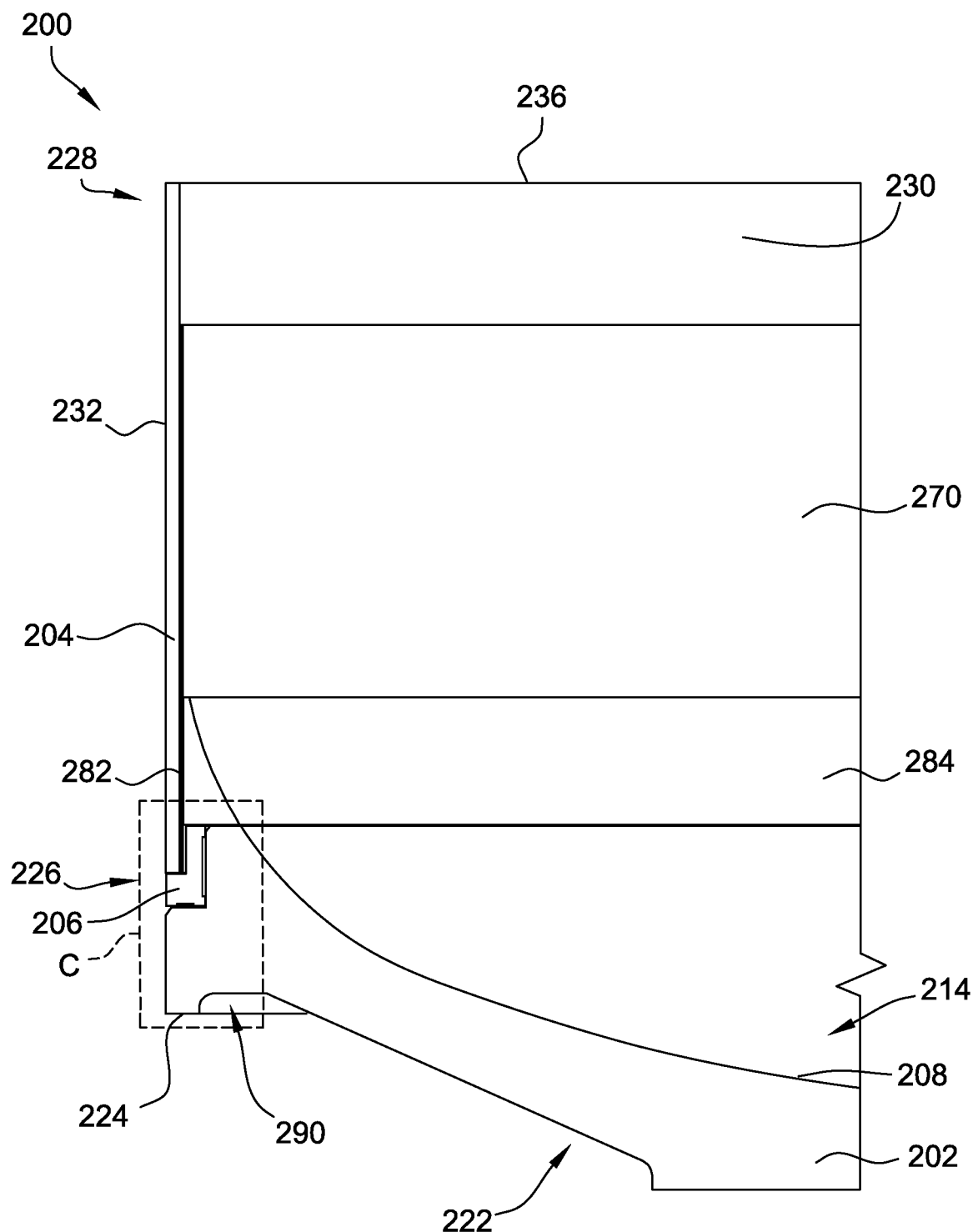
FIG. 4 is a partial cross-section of the susceptor assembly shown in FIGS. 2 and 3.
Figure 5:
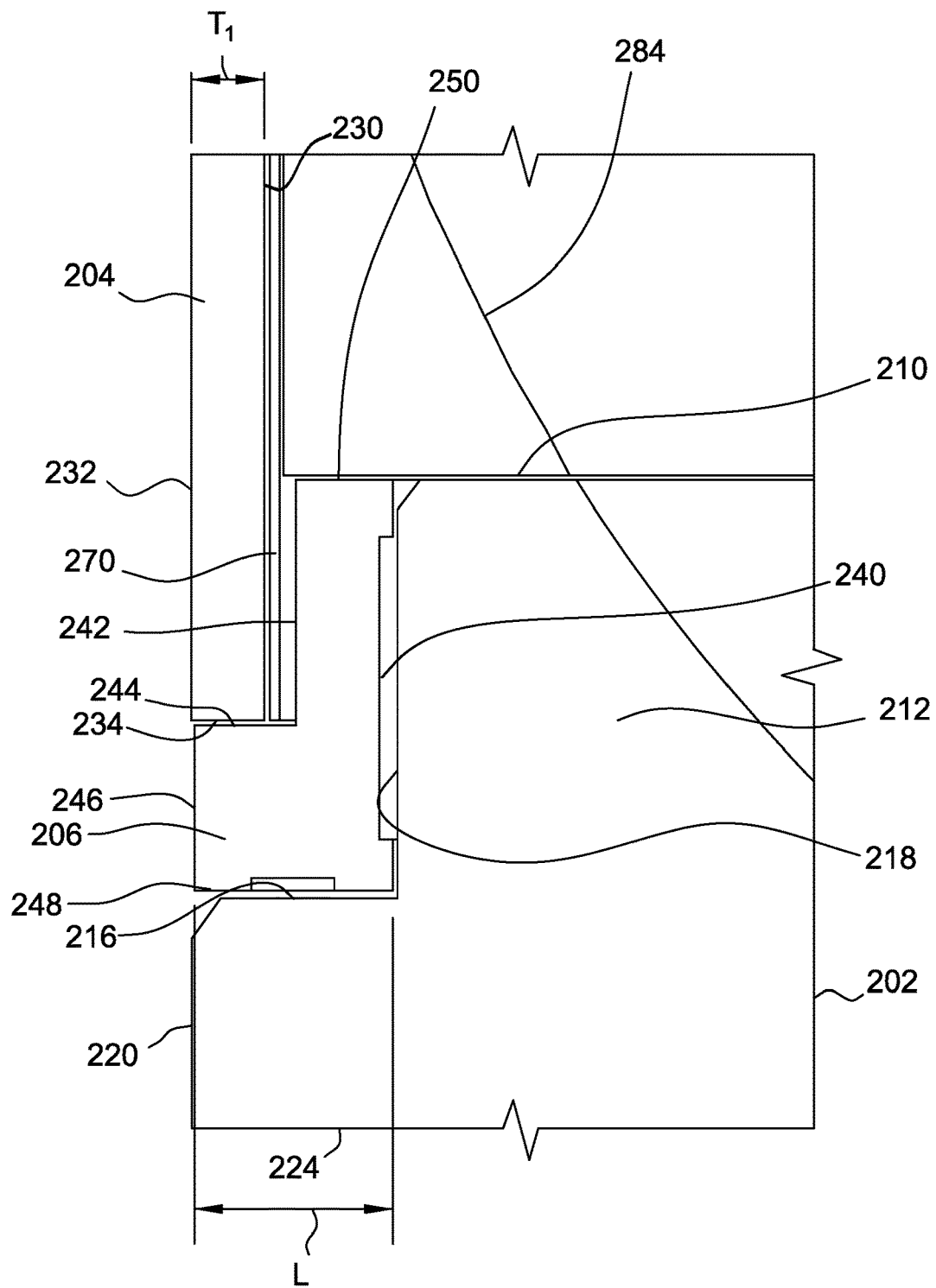
FIG. 5 is an enlarged view of a portion of the cross-section of the susceptor assembly shown in FIG. 4.

Referring now to FIGS. 4 and 5, when the sacrifice ring 206 is installed onto the base 202, the inner surface 240 faces the outer surface 218 of the annular wall 212, and the bottom surface 248 faces the shoulder 216. The height $H_2$ of the inner surface 240 is substantially equal to a height of the outer surface 218 of the annular wall 212, such that the inner surface 240 substantially extends across and surrounds the outer surface 218. The thickness $T_2$ of the bottom surface 248 is substantially equal to the radial length L of the shoulder 216, such that the bottom surface 248 substantially extends across and overlays the shoulder 316 and the outer edge 246 is substantially flush with the circumferential edge 220 of the susceptor base 202.

When the sacrifice ring 206 is installed and the sidewall 204 is connected to the susceptor base 202, the first edge 234 of the sidewall 204 engages the ledge 244. The thickness $T_4$ of the ledge 244 is suitably sized to enable engagement between the ledge 244 and the first edge 234 of the sidewall 204. The upper portion 252 of the sacrifice ring 206 is received by the first end 226 of the sidewall 204 when the sidewall 204 is connected to the base 202, such that the outer surface 242 faces the interior surface 230 of the sidewall 204. The thickness $T_4$ of the ledge 244 may be slightly larger than the thickness $T_1$ of the sidewall 204, such that a space (not shown) is provided between the outer surface 242 and the interior surface 230. The space enables a strip 270 of flexible graphite material (e.g., GraFoil® Flexible Graphite material) to be placed between the outer surface 242 and the interior surface 230.

Accordingly, as shown in FIGS. 4 and 5, when the susceptor assembly 200 is assembled, the sacrifice ring 206 forms a layer between surfaces of the susceptor base 202 and the sidewall 204 that are exposed during operation of the ingot puller 100 along a region at risk of accumulating SiC deposits that would negatively affect a connection between the susceptor base 202 and the sidewall 204. In particular, the sacrifice ring 206 is interposed between the outer surface 218 and the shoulder 216 of the susceptor base 202 and the interior surface 230 of the sidewall 204.

Suitably, a shape defined by the ledge 244 and the outer surface 242 may complement (or match) the shape defined by the outer surface 218 of the annular wall 212 and the shoulder 216 of the base 202. In the example embodiment, the ledge 244 is orthogonal with the outer surface 242 such that the ledge 244 and the outer surface 242 define an L-shape. In other examples, the outer surface 242 and/or the ledge 244 may have an alternative configuration or orientation to complement the shape defined by the outer surface 218 and the shoulder 216. Additionally, the transition between the outer surface 242 and the ledge 244 may be sharp or angular, or may be rounded to provide a smooth transition between the adjacent surfaces. By complementing the shape defined by the outer surface 218 of the annular wall 212 and the shoulder 216 of the base 202, the susceptor assembly 200 may be retrofitted with the sacrifice ring 206 interposed between the susceptor base 202 and the sidewall 204 without a substantial change in the design of the susceptor base 202 and the sidewall 204. For example, the susceptor base 202 and the sidewall 204 may be configured such that the susceptor assembly 200 is enabled to function with the first end 234 of the sidewall 204 in direct engagement with the shoulder 216, without the sacrifice ring 206 therebetween, and the sacrifice ring 206 may be included without substantially changing the size, shape, dimensions, or other configurations of the susceptor base 202 and the sidewall 204.

Referring now to FIGS. 7 and 8, the inner surface 240 and/or the bottom surface 248 are designed to facilitate minimizing contact between the sacrifice ring 206 and the susceptor base 202. The inner surface 240 includes a recessed portion 272 having a recessed surface 274 and the bottom surface 248 includes a recessed portion 276 having a recessed surface 278. When the sacrifice ring 206 is installed on the susceptor base 202, the recessed surface 274 of the inner surface 240 is spaced from the outer surface 218 of the annular wall 212 and the recessed surface 278 of the bottom surface 248 is spaced from the shoulder 216. The inner surface 240 and the bottom surface 248 only partially contact the outer surface 218 and the shoulder 216, respectively, at areas where the respective recessed portion 272 and 276 is not formed. As shown in FIGS. 7 and 8, the recessed portions 272 and 276 may be formed along a middle portion of the respective surface 240 and 248. As such, the inner surface 240 only contacts the outer surface 218 proximate the first end 254 and the second end 256 of the inner surface 240, and the bottom surface 248 only contacts the shoulder 216 proximate the second end 256 of the inner surface and the first end 258 of the outer edge 246. The recessed portions 272 and 276 may be formed along a substantial portion of the respective surface 240 and 248 to facilitate minimizing contact between the sacrifice ring 206 and the susceptor base 202. For example, the recessed portions 272 and 276 may extend along at least (no less than) 20%, at least 30%, at least 40%, at least 50%, at least 60%, at least 70%, or even at least 75% of the height $H_1$ of the inner surface 240 and the thickness $T_2$ of the bottom surface 248, respectively.

The sacrifice ring 206 also may also include a projection 280 or a series of projections 280 that are integrally formed on and extend outward from the outer surface 242 and facilitate minimizing contact between the sacrifice ring 206 and the interior surface 230 of the sidewall 204 (or the flexible graphite material strip 270 placed between the outer surface 242 and the interior surface 230). In an embodiment including a series of projections 280 on the sacrifice ring 206, the projections 280 may be spaced apart from one another and disposed circumferentially along the outer surface 242. For example, FIGS. 7 and 8 show cross-sections of the sacrifice ring 206 at a location where one of a series of projections 280 is formed (FIG. 7) and a portion where a projection 280 is not formed (FIG. 8). The projection(s) 280 space the outer surface 242 from the interior wall 230 (or the flexible graphite material strip 270). As shown in FIG. 7, the projection(s) may be formed proximate the first end 260 of the outer surface 242.

Referring now to FIGS. 3 and 4, the susceptor assembly 200 also includes a sealing ramp 282 and one or more flexible graphite material strips 270. The sealing ramp 282 is positioned on the upper edge 210 of the susceptor base 202 and the upper edge 250 of the sacrifice ring 206, and extends across each of the upper edge 210 and the upper edge 250. The sealing ramp 282 is suitably formed of graphite. The sealing ramp 282 includes a curved surface 284 that facilitates a smooth transition between the concave surface 208 of the susceptor base 202 and the interior surface 230 of the sidewall 204. The sealing ramp 282 also includes a back surface 286 opposite the curved surface 284, where the back surface 286 may be straight and substantially flush with the outer surface 242 of the sacrifice ring 206. The ramp 282 may be provided to complete the shape of the interior 238 such that, when the crucible 104 is received therein, the interior wall 230, the curved surface 284, and the concave surface 208 for a complete and rigid support surface that contacts and supports the crucible 104 during operation of the ingot puller 100, in which the quartz crucible 104 may soften due to the temperatures needed to melt the silicon charge and/or maintain the melt 102.

As shown in FIG. 3, the sealing ramp 282 is segmented into six segments. In other examples, the sealing ramp 282 may be segmented into more or fewer segments, such as two, three, four, five, seven, eight, nine or ten segments. The flexible graphite material strip(s) 270 may form a sacrificial layer between the quartz crucible 104 and the interior surface 230 to facilitate preventing and/or minimizing direct contact between the silica generated from the quartz crucible and the carbon in the sidewall 204, which may otherwise lead to undesired deposits or unwanted gaseous byproducts generated during operation of the ingot puller 100.

In operation of the ingot puller 100 (shown in FIG. 1), silicon-containing gases, such as silicon oxide ($SiO_X$) species, evaporate from the melt 102 during a crystal growth process and contact carbon-containing materials of the susceptor assembly 200 used to support the crucible 104. The area of the susceptor assembly 200 where the susceptor base 202, the sacrifice ring 206, and the first end 226 of the sidewall 204 meet is located proximate the heating system 122. As such, this area is subjected to relatively higher temperatures than other regions of the susceptor assembly 200. The higher temperatures induce greater reaction rates between carbon-containing materials and silicon-containing gases that contact each other. The reaction generates oxidized carbon and silicon products in a gaseous form, as well as silicon carbide (SiC) deposits. The SiC deposits accumulate along the sacrifice ring 206 interposed between the base 202 and the sidewall 204. Once the SiC deposits have accumulated to a point where the sacrifice ring 206 can no longer form a suitable connection with the base 202 and/or the sidewall 204, the sacrifice ring 206 may be removed and replaced, salvaging the susceptor base 202 and the sidewall 204 for successive operations. The sacrifice ring 206 may also be segmented, so that segments that accumulate a greater amount of SiC deposits may be removed and replaced without replacing the entire sacrifice ring 206. Additionally, the sacrifice ring 206 includes the recessed portion 272 of the inner surface 240 and the recessed portion 276 of the bottom surface 248 that facilitate minimizing contact between the sacrifice ring 206 and the susceptor base 202, and includes projection 280 or the series of projections 280 that facilitate minimizing contact between the sacrifice ring 206 and the interior surface 230 of the sidewall 204 (or the flexible graphite material strip(s) 270). Minimizing contact between the sacrifice ring 206 and the adjacent carbon-containing components facilitates reducing any bonding of the sacrifice ring 206 to these components that may be caused by accumulated SiC deposits, thereby enabling the sacrifice ring 206 to be readily removed and replaced.

Referring to FIG. 9, an example method 300 of assembling the susceptor assembly 200 (shown in FIGS. 2-5) is shown. The method includes providing 302 a susceptor base 202. The susceptor base 202 has a concave surface 208 that extends radially inward from an upper edge 210. The susceptor base 202 also includes an annular wall 212 that extends from the upper edge 210 to a shoulder 216. The shoulder 216 extends radially outward from an outer surface 218 of the annular wall 212 opposite the concave surface 208. The susceptor base 202 is formed of a carbon-containing material, such as graphite, for example.

The method 300 also includes installing 304 a sacrifice ring 206 onto the susceptor base 202. The sacrifice ring 206 may be installed 304 onto the susceptor base 202 by fitting the sacrifice ring 206 around the annular wall 212 and supporting the sacrifice ring 206 on the shoulder 216. Additionally, the sacrifice ring 206 may be formed of two or more segments 206a, and the segmented sacrifice ring 206 is installed 304 onto the base 202 by placing each segment 206a onto the shoulder and forming the sacrifice ring 206 around the annular wall 212. When installed 304, the sacrifice ring 206 has a first surface 240 that surrounds the outer surface 218 of the annular wall 212, a second surface 242 opposite the first surface 240, a ledge 244 extending outward from the second surface 242, and a third surface 248 opposite the ledge 244 that overlays the shoulder 216 of the susceptor base 202. The sacrifice ring 206 may be formed of a carbon-containing material, such as graphite, for example.

The method 300 also includes connecting 306 a tubular sidewall 204 to the susceptor base 202 by inserting the annular wall 212 into a first end 226 of the sidewall 204. The sidewall 204 has a first edge 234 at the first end 226 that engages the ledge 244 of the sacrifice ring 206. The sacrifice ring 206 is thereby interposed between the sidewall 204 and each of the outer surface 218 of the annular wall 212 and the shoulder 216. The sidewall 204 is formed of a carbon-containing material, such as carbon fiber, for example.

The method 300 may also include positioning 308 a crucible 104 in an interior 238 of the susceptor assembly 200. The interior 238 is defined by an interior surface 230 of the sidewall 204 and the concave surface 208 of the susceptor base 202. The susceptor assembly 200 may be installed within a housing 106 of an ingot puller 100 and supported on a rotatable shaft 120 prior to positioning 308 the crucible in the interior 238.

The method 300 may also include steps for disassembling the susceptor assembly 200. For example, the method 300 may include removing 312 the sidewall 204 from the susceptor base 202. If positioning 308 the crucible 104 in the interior 238 is performed, the method 300 may include removing 312 the crucible 104 from the interior 238 prior to removing 312 the sidewall 204 from the susceptor base 202. After the sidewall 204 is removed 312, the method 300 may include removing 314 the sacrifice ring 206 from the susceptor base 202.

Figure 10:
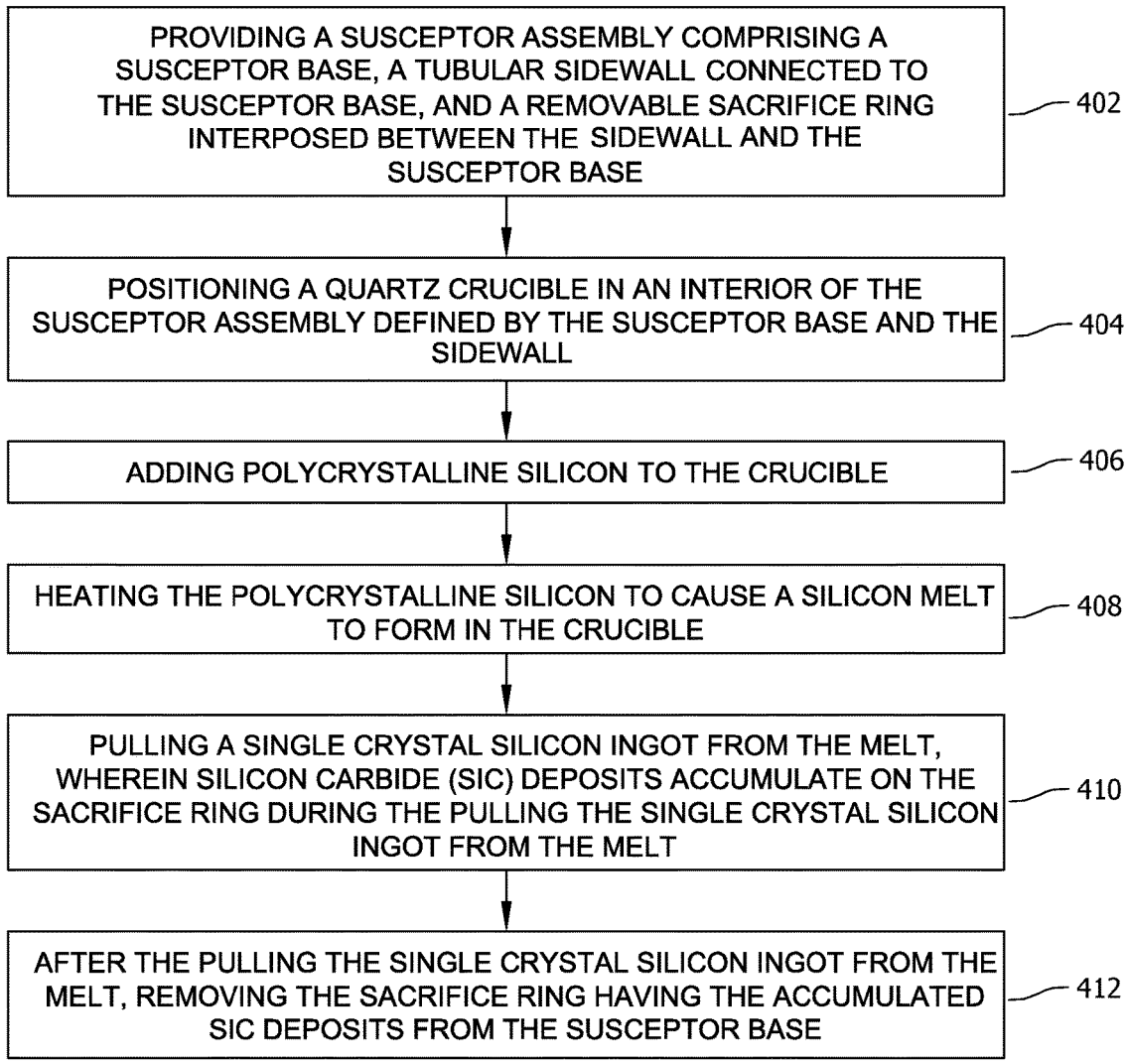
FIG. 10 is a method of producing a single crystal silicon ingot from a silicon melt contained within a crucible supported by the susceptor assembly shown in FIGS. 2-5.

Referring to FIG. 10, an example method 400 of producing a single crystal silicon ingot from a silicon melt 102 contained within a crucible 104 supported by the susceptor assembly 200 (shown in FIGS. 2-5) is shown. The method 400 may be performed using the ingot puller 100 (shown in FIG. 1), where the susceptor assembly 200 is used as the susceptor 118.

The method 400 includes providing 402 the susceptor assembly 200. The susceptor assembly 200 includes a susceptor base 202, a tubular sidewall 204 connected to the susceptor base 202, and a removable sacrifice ring 206 interposed between the sidewall 204 and the susceptor base 202. The susceptor assembly 200 may be assembled according to the method 300 (shown in FIG. 9). Each of the susceptor base 202 and the sidewall 204 are formed of a carbon-containing material. For example, the susceptor base 202 may be formed of graphite and the sidewall 204 may be formed of carbon fiber. The sacrifice ring 206 may also be formed of a carbon-containing material, such as graphite, for example.

The method 400 also includes positioning 404 the quartz crucible 104 in an interior 238 of the susceptor assembly 202 defined by the susceptor base 202 and the sidewall 204, adding 406 polycrystalline silicon to the crucible 104, heating 408 the polycrystalline silicon to cause the silicon melt 102 to form in the crucible 104, and pulling 410 a single crystal silicon ingot from the melt 102. During the pulling 410 the single crystal silicon ingot from the melt 102, silicon carbide (SiC) deposits accumulate on the sacrifice ring 206. After pulling 410 the single crystal silicon ingot from the melt 102, the sacrifice ring 206 having the accumulated SiC deposits is removed 412 from the susceptor base 202. The sacrifice ring 206 may be segmented into two of more segments 206a, and removing 412 the segmented sacrifice ring 206 having the accumulated SiC deposits from the susceptor base 202 includes independently removing one or more of the segments 206a. Removing 412 the sacrifice ring 206 having the accumulated SiC deposits from the susceptor base may be performed after producing multiple single crystal silicon ingots. After removing the sacrifice ring 206 having the accumulated SiC deposits from the susceptor base 202, the method 400 may further include installing a second sacrifice ring 206 onto the susceptor base 202.

Advantages of the above examples include facilitating increasing an operational lifetime of components of a susceptor assembly by providing a removable sacrifice ring. In hybrid susceptor assemblies that include a susceptor base and a sidewall each formed of a carbon-containing material, silicon carbide (SiC) deposits may accumulate over time along the contact interface between the base and the sidewall. Removal of the SiC deposits, which have a hardness close to diamond, is costly and time-consuming and, as a result, the susceptor base is frequently discarded and replaced with a new base. The accumulated SiC deposits may also cause bonding of the susceptor base and the sidewall, requiring the bonded structure to be discarded if either the base or the sidewall is damaged. In both cases, material costs are increased. In accordance with the present disclosure, a sacrifice ring is provided that accumulates the SiC deposits and that is easily removed and replaced. With the sacrifice ring, the operational lifetime of the sidewall and the susceptor base can be increased. Additionally, the sacrifice ring may be configured to be retrofitted onto susceptor assemblies without requiring substantial design changes in the susceptor base and sidewall.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A susceptor assembly for supporting a crucible during a crystal growth process, the susceptor assembly comprising:
   a susceptor base formed of a carbon-containing material, the susceptor base having a concave surface extending radially inward from an upper edge, and an annular wall extending from the upper edge to a shoulder, the shoulder extending radially outward from an outer surface of the annular wall opposite the concave surface;
   a tubular sidewall formed of a carbon-containing material, the tubular sidewall being connected at a first end to the susceptor base, the first end of the sidewall receiving the annular wall to connect the sidewall to the susceptor base, an interior surface of the sidewall and the concave surface of the susceptor base defining an interior of the susceptor assembly sized and shaped to receive the crucible therein; and
   a removable sacrifice ring interposed between the sidewall and the outer surface of the annular wall and interposed between the sidewall and the shoulder, the sacrifice ring having a first surface that faces the outer surface of the annular wall, a second surface that faces the interior surface of the sidewall, and a ledge extending outward from the second surface that engages the first end of the sidewall.

2. The susceptor assembly of claim 1, wherein the sacrifice ring is segmented into two or more segments.

3. The susceptor assembly of claim 2, wherein the sacrifice ring is segmented into six equally-sized segments.

4. The susceptor assembly of claim 1, wherein the sacrifice ring is formed of a carbon-containing material.

5. The susceptor assembly of claim 1, wherein the second surface and the ledge of the sacrifice ring define a shape of the sacrifice ring that complements a shape defined by the outer surface of the annular wall and the shoulder.

6. The susceptor assembly of claim 5, wherein the second surface and the ledge of the sacrifice ring define a L-shape.

7. The susceptor assembly of claim 1, wherein the first surface of the sacrifice ring is in partial contact with the outer surface of the annular wall, wherein a recess is formed in the first surface to define a recessed surface that is spaced a distance from the outer surface of the annular wall.

8. The susceptor assembly of claim 7, wherein the first surface of the sacrifice ring is in contact with the outer surface of the annular wall proximate opposing ends of the first surface and the recess is formed in a middle portion of the first surface.

9. The susceptor assembly of claim 1, wherein the sacrifice ring has at least one projection extending outward from the second surface, the at least one projection being in contact with the interior surface of the sidewall and the second surface being spaced a distance from the interior surface.

10. The susceptor assembly of claim 9, wherein the at least one projection comprises a series of spaced apart projections that are disposed circumferentially along the second surface of the sacrifice ring.

11. The susceptor assembly of claim 1, wherein the sacrifice ring has a third surface that faces the shoulder of the susceptor base, the third surface being in partial contact with the shoulder, wherein a recess is formed in the third surface to define a recessed surface that is spaced a distance from the shoulder.

12. The susceptor assembly of claim 11, wherein the third surface of the sacrifice ring is in contact with the shoulder proximate opposing ends of the third surface and the recess is formed in a middle portion of the third surface.

13. A method of assembling a susceptor for supporting a crucible during a crystal growth process, the method comprising:
   providing a susceptor base formed of a carbon-containing material, the susceptor base having a concave surface extending radially inward from an upper edge, and an annular wall extending from the upper edge to a shoulder, the shoulder extending radially outward from an outer surface of the annular wall opposite the concave surface;
   installing a sacrifice ring onto the susceptor base, the sacrifice ring having a first surface that surrounds the outer surface of the annular wall, a second surface opposite the first surface, a ledge extending outward from the second surface, and a third surface opposite the ledge that overlays the shoulder of the susceptor base; and connecting a tubular sidewall formed of a carbon-containing material to the susceptor base by inserting the annular wall into a first end of the sidewall such that the first end engages the ledge of the sacrifice ring and the sacrifice ring is interposed between the sidewall and the outer surface of the annular wall and interposed between the sidewall and the shoulder.

14. The method of claim 13, further comprising positioning a crucible in an interior of the susceptor defined by an interior surface of the sidewall and the concave surface of the susceptor base.

15. The method of claim 13, further comprising removing the sidewall from the susceptor base and, subsequently, removing the sacrifice ring from the susceptor base.

16. The method of claim 15, wherein the sacrifice ring is segmented into two or more segments, and removing the sacrifice ring from the susceptor base includes independently removing one or more of the segments.

17. An ingot puller for producing single crystal semiconductor ingots, the ingot puller comprising:
a housing defining a growth chamber;
a crucible positioned in the growth chamber; and
a susceptor assembly supporting the crucible in the growth chamber, the susceptor assembly comprising:
a susceptor base formed of a carbon-containing material, the susceptor base having a concave surface extending radially inward from an upper edge, and an annular wall extending from the upper edge to a shoulder, the shoulder extending radially outward from an outer surface of the annular wall opposite the concave surface;
a tubular sidewall formed of a carbon-containing material, the tubular sidewall being connected at a first end to the susceptor base, the first end of the sidewall receiving the annular wall to connect the sidewall to the susceptor base, an interior surface of the sidewall and the concave surface of the susceptor base defining an interior of the susceptor assembly that receives the crucible therein; and
a removable sacrifice ring interposed between the sidewall and the outer surface of the annular wall and interposed between the sidewall and the shoulder, the sacrifice ring having a first surface that faces the outer surface of the annular wall, a second surface that faces the interior surface of the sidewall, and a ledge extending outward from the second surface that engages the first end of the sidewall.

18. The ingot puller of claim 17, wherein the sacrifice ring is segmented into two or more segments.

19. The ingot puller of claim 17, wherein the second surface and the ledge of the sacrifice ring define an L-shape of the sacrifice ring that complements an L-shape defined by the outer surface of the annular wall and the shoulder.

20. The ingot puller of claim 17, wherein:
the first surface of the sacrifice ring is in partial contact with the outer surface of the annular wall, wherein a recess is formed in the first surface to define a recessed surface that is spaced a distance from the outer surface of the annular wall,
the sacrifice ring has a series of spaced apart projections disposed circumferentially along the second surface of the sacrifice ring, each projection extending outward from the second surface and being in contact with the interior surface of the sidewall, the second surface being spaced a distance from the interior surface, and
the sacrifice ring has a third surface that faces the shoulder of the susceptor base, the third surface being in partial contact with the shoulder, wherein a recess is formed in the third surface to define a recessed surface that is spaced a distance from the shoulder.

\* \* \* \* \*